United States Patent [19]

Schaefer, III

[11] 4,177,521
[45] Dec. 4, 1979

[54] OUTPUT TIMING ARRANGEMENT FOR SINGLE-WALL MAGNETIC DOMAIN APPARATUS

[75] Inventor: Edwin M. Schaefer, III, North Aurora, Ill.

[73] Assignee: Bell Telephone Laboratories, Incorporated, Murray Hill, N.J.

[21] Appl. No.: 890,662

[22] Filed: Mar. 27, 1978

[51] Int. Cl.² ............................................. G11C 19/08
[52] U.S. Cl. .......................................... 365/8; 365/193
[58] Field of Search ......................... 365/7, 8, 189, 193

[56] References Cited
U.S. PATENT DOCUMENTS

| 3,813,660 | 5/1974 | Buhrer | 365/8 |
| 3,838,406 | 9/1974 | Cohen et al. | 365/8 |
| 3,997,877 | 12/1976 | Naden | 365/6 |

Primary Examiner—James W. Moffitt
Attorney, Agent, or Firm—William H. Kamstra

[57] ABSTRACT

An output timing arrangement for single-wall magnetic domain apparatus for ensuring the concurrence of a domain-generated output signal and the output strobe. Voltages generated at the detector array of the apparatus by its in-plane rotating drive field are employed prior to readout to control the timing of the strobe signal. More specifically, the voltages generated by the rotating field at the second harmonic frequency of its fundamental frequency are filtered out to generate timing data indicative of the precise time at which a domain-generated signal may be expected during a subsequent readout operation. The occurrence of the output strobe signal is thus caused to track variations in the phase angle of the rotating field, which variations in the past frequently affected the strobe timing and hence the reliability of readout.

7 Claims, 1 Drawing Figure

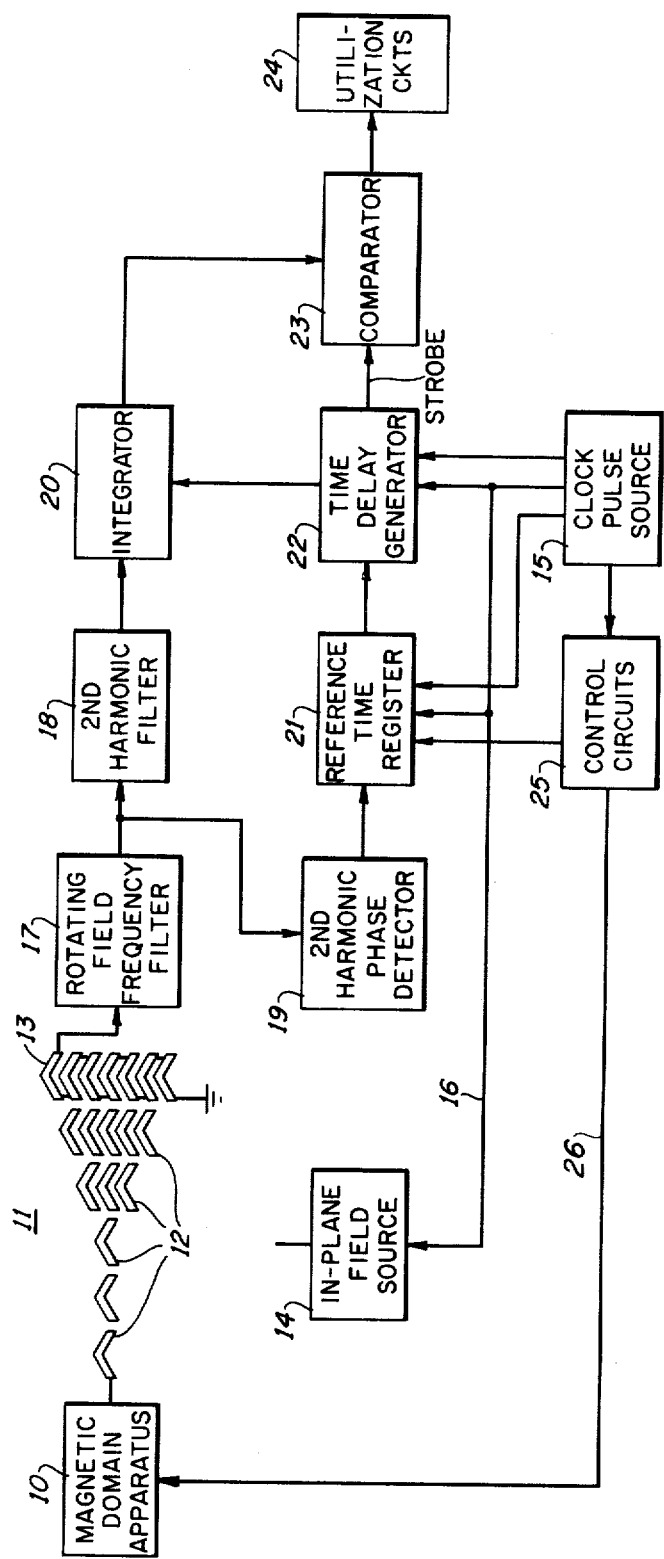

OUTPUT TIMING ARRANGEMENT FOR SINGLE-WALL MAGNETIC DOMAIN APPARATUS

BACKGROUND OF THE INVENTION

This invention relates to a single-wall magnetic domain arrangements and more particularly to detection circuits adapted for use in such arrangements.

The advancements in the single-wall magnetic domain technology in recent years have resulted in the realization of various and numerous data processing, memory, and other applications. The control of domain propagation in a thin film magnetic medium and the novel circuits achieved thereby are wellknown and have been extensively treated in the general and patent literature. The manner in which the domains (or "bubbles", as they are familiarly termed) are initially created in a thin film medium is also wellknown. An external bias field of suitable polarity is applied perpendicularly to the plane of the medium to reduce randomly oriented, elongated domain patterns to the individual, cylindrical, bubble-like domains employable as binary bit representations. Once generated, the domains are propagated from point to point within the medium of a system by arrays of magnetic elements such as the familiar Permalloy chevrons, or "T's" and bars, which are magnetized by an externally generated in-plane rotating magnetic field. This rotating field is frequently employed in a single-wall domain system as the timing basis for controlling the various operations of the system. In one prior art system disclosed in U.S. Pat. No. 3,997,877, issued Dec. 14, 1976, to R. A. Naden, for example, the propagation of domains in a magnetic medium is synchronized by counting the number of rotations of the rotating field to determine the proper instant of transfer of the domains from one point to another in the medium. The same rotating field also functions to control the readout of the domain apparatus which is accomplished in one typical arrangement by propagating a domain from the apparatus along a detector path comprising Permalloy propagation elements to a detection array of elements having magnetoresistive characteristics. The presence of a domain in the array is detected magnetoresistively in that the resistance of the array to a current varies in response to the magnetic flux of the domain. When a domain is propagated to a point under the array, the resistance is changed thereby generating an output signal across the array.

The output signal generated by the presence of a domain under the array is a function of the position of the domain relative to the detection array. The output signal waveform is a function of the domain position under the array, that position in the detector array being determined by the direction of the field at the time of readout. In one typical readout arrangement, a domain generated output signal has an amplitude of approximately 700 microvolts and has a duration of approximately 300 nanoseconds of a rotating field cycle of 2800 nanoseconds. In this typical arrangement, the waveform of the output signal is not specified, only the integral of the voltage over the 300 nanoseconds is determined. Accordingly, in such and other arrangements it becomes important to determine the precise times to begin and terminate the integration period to an accuracy commensurate with the output signal duration, in the foregoing illustrative case, a duration of 300 nanoseconds. The direction of the rotating field which determines the position of a domain in the detector array is not precisely determined in time, however. The rotating drive field is generated by causing two nominally sinusoidal currents to pass through two coils with perpendicular axes which encircle the magnetic medium carrying the domains. In the ideal case, where current waveshapes, physical alignment of the structural elements, winding and wiring dimensions, and the like, are perfect, the angle (direction) of the rotating field vector would be precisely linearly proportional to time. In practice, however, none of these ideal conditions are met. As a result, the time relationship between the timing clock of the system which controls the rotating field circuits and the ultimate output signal of the system is uncertain to a degree comparable to the duration of the output signal. As a result, where, for the foregoing reasons, the arrival time of an output signal at the detector is not precisely determined and, on the other hand, the output strobe is controlled to occur at a fixed time, the reliability of readout of a magnetic domain system may be seriously affected. It is to this problem that the detection circuit of this invention is chiefly directed.

SUMMARY OF THE INVENTION

One illustrative single-wall magnetic domain readout timing arrangement according to the principles of this invention, in one of its aspects, is based on the aforementioned fact that the magnetic interaction of the rotating drive field with the detector array elements causes a voltage to appear at the detection array terminals. The magnetoresistive effect is a magnitude effect; accordingly, the generated output voltage has a component at the second harmonic frequency of the rotating field frequency. The phase of the rotating field component of the detector output voltage is thus directly related to the direction in which the rotating field vector lies with respect to the Permalloy elements of the detector array. Since both the domain position at the detector readout point and the phase of the second harmonic component of the detector voltage output are determined by the rotating field direction, the second harmonic output is advantageously employed, in accordance with one aspect of this invention, to provide timing information for the detector output.

In one implementation of the invention, a phase detector circuit is provided to gate into a register the clock time at which one of the zero crossings of the second harmonic frequency of the rotating drive field occurs. A known, predetermined characteristic delay of the particular domain medium and supporting structure under consideration is added to the time determined by the phase detector circuit to generate signals for controlling the output strobe of the detector circuit. This timing operation advantageously does not introduce additional delay for its accommodation and hence does not increase the time required for the readout of the apparatus. The timing operation of the invention is accomplished during the delay normally encountered after a readout decision is made. In a memory application, for example, the domain content of the magnetic medium is first transferred to a path leading to the detector array before the actual readout at the arrays is accomplished.

Having determined the time at which the domain output signal will arrive at the detector, the effect of the uncertain time relationship between the system clock and the rotating field is advantageously reduced to a negligible magnitude. Further, the buses which distribute timing information for the rotating field coil and which transmit the detector array signals to the detector circuit are sufficiently long to contribute significant delay. This delay is also compensated for by the timing arrangement of this invention; since the timing information, that is, the second harmonic component of the rotating field, and the domain signal to be detected are both transmitted over the same path, they both suffer approximately the same delay. As a result, in accordance with the principles of the present invention, domain generated output signals are advantageously detectable notwithstanding tolerance variations and variable delays introduced by other frame and system factors.

BRIEF DESCRIPTION OF THE DRAWING

The organization and operation of a single-wall magnetic domain timing arrangement according to the principles of this invention together with its features will be better understood from a consideration of the detailed description of one specific illustrative embodiment thereof which follows when taken in conjunction with the accompanying drawing in which the single FIGURE thereof depicts in block symbol form the organization of one specific illustrative timing arrangement according to this invention shown as operating in conjunction with a generalized magnetic domain apparatus which may comprise, for example, a major-minor loop domain memory.

DETAILED DESCRIPTION

The organization of one specific timing arrangement according to this invention is shown in the drawing as employed as an adjunct to a single-wall magnetic domain apparatus 10, which apparatus may typically comprise, for example, a well-known minor-major loop memory. The output of apparatus 10 conventionally comprises a detector array 11 in turn comprising a plurality of Permalloy chevron elements 12 arranged to expand single-wall domains as they appear during a readout operation. As finally expanded, a domain appears in a chevron detector 13 where an output signal is magnetoresistively generated thereby all in a manner well-known in the art. The Permalloy elements of detector array 11 and final detector 13 are assumed to be affixed to a thin film layer also known, in which single-wall domains can be created and propagated, which layer is not shown in the drawing as not being essential to a complete understanding of the invention.

The propagation of magnetic domains from point to point within the magnetic media of apparatus 10 and its output section is conventionally accomplished by an in-plane rotating field generated by a field source 14. Source 14 is shown in block symbol form only, the details thereof being readily envisioned by one skilled in the art. Typically, a rotating field is generated by causing two nominally sinusoidal currents to pass through two coils with perpendicular axes which enclose the magnetic media of the domain apparatus. The frequency of the rotating field is controlled by periodic clock pulses generated by a system clock pulse source 15 transmitted to field source 14 via conductor 16. These periodic clock pulses are conventionally generated by counting the occurrence of a predetermined number of output pulses of a higher frequency oscillator. Returning to the output section of domain apparatus 10, the output of detector 13 is seen as being applied to a first filter circuit, rotating field frequency filter 17, the output of which filter is in turn applied at two subsequent stage circuits. A first stage comprises a second harmonic of the rotating field frequency filter 18 and the second is a second harmonic phase detector 19. For reasons which will appear hereinafter, filters 17 and 18 are functionally interposed between output detector 13 and a conventional integrator circuit 20 which in a manner well-known in the art is employed to integrate significant output signals generated by domains appearing at detector 13.

At the second harmonic phase detector 19, an output is applied to a reference time register 21, which register serves simply to count output pulses of the previously mentioned high frequency oscillator occurring between clock pulses received from clock pulse source 15 and phase detector 19. Time interval data is applied from the output of register 21 to a fixed time delay generator 22, the outputs of which serve both to reset integrator 20 and to act as an output strobe for strobing output signals due to domains read out of domain apparatus 10. The strobing operation is accomplished by an output comparator 23 to which both the strobe output of delay generator 22 and the signal output from integrator 20 are applied. Finally, a logic level output indicative of a binary "1" or "0" is applied to utilization circuits 24 which may comprise any data processing circuits requiring the binary information to be read out of domain apparatus 10. The operation of the domain apparatus 10 is controlled by control circuit 25 via a conductor 26 and also controls the rotation of the in-plane rotating field through clock pulse source 15. Thus, control circuit 25 controls the time of read out of apparatus 10 and determines when the time interval data of register 21 is applied to delay generator 22. The circuits referred to in the foregoing are shown in block symbol form only, their details being readily envisioned by one skilled in the art considering the functions to be ascribed thereto hereinafter. Indeed, circuits and devices 14, 15, 20, 23, and 25 are assumed as being already present in connection with domain apparatus 10 with which the timing arrangement of this invention may be associated. Accordingly, these circuits need not be described other than to consider their functions for a complete understanding of this invention.

With the foregoing organization of a timing arrangement according to this invention in mind, illustrative operations thereof may now be considered. Once a decision originating at control circuits 25 to read the contents of a particular address of domain apparatus 10 is made, the stored data is transferred or replicated onto a path leading to detector array 11 and output detector 13. The delay time required for a domain to appear at detector 13, which may typically comprise 50 propagation cycles of the rotating field, is advantageously employed in accordance with this invention, to determine the precise time at which an information signal may be expected at comparator 23 and hence when the strobe operation must be accomplished. During this delay time and at nonreadout times, a number of noninformation significant voltages appear at output detector 13. A first such voltage is generated by electromagnetic coupling from the continuously rotating field coil structure. The same rotating field interacts with detector 13 to generate the second harmonic voltage. Finally, the output of detector 13 includes random noise voltages generated, for example, by the manipulation of domains in domain apparatus 10.

As the foregoing voltages appear at detector 13 output, the voltages generated by the rotating field coupling at its fundamental frequency are suppressed by filter 17 which filter permits the voltages at the second harmonic frequency of the rotating field and the ramdom noise voltages to pass. Filter 18 is next provided to suppress the former voltages at the second harmonic frequency and prevents the latter voltages from obscuring any significant domain generated signals during readout. The output of filter 17, that is, the voltages generated by the coupling of the rotating field at the second harmonic of its fundamental frequency, is also applied to second harmonic detector 19. At this point the zero crossings of the second harmonic voltages are detected and signals indicative of the fact and times of the crossings are generated and are applied from the output of detector 19 to the input of reference time register 21.

Time register 21 is adapted to count time intervals between each periodic clock pulse from source 15 and the arrival of a phase input from detector 19 and operates under the control of the system control circuits 25. Under this control, register 21 retains its time data until such time as a decision to read data from domain apparatus 10 is made; at that time the time data is transmitted to time delay generator 22. At the latter stage, data representing an additional, fixed delay as determined by the geometry of the particular magnetic media of apparatus 10 is added to the time data to control the generation of an output strobe signal. The latter signal is applied under the control of a clock pulse from source 15 to both integrator 20 and output comparator 23. At the former stage, a domain generated signal (if one is present) is integrated and its output voltage level (which may be representative of a binary "1") is transmitted to comparator 23. The latter circuit which may conventionally comprise a high gain amplifier, conventionally operates under the control of an enabling strobe pulse from generator 22 to distinguish between voltage levels received from integrator 20 to generate a "1" or "0" output signal as determined by those levels.

Advantageously, and in accordance with one feature of a timing arrangement of this invention, the same factors, that is, rotating field phase angle variations and propagation delays characteristic of magnetic apparatus geometries, which control the arrival times of domain generated signals at the output comparator, also control the timing of the output enabling strobe pulse. As a result, the concurrence of an information signal and its strobing at comparator 23, and hence the reliability of readout is assured. Information representative signals generated at comparator 23 are transmitted to utilization circuits 24 which may comprise any circuits of a data processing system with which the timing arrangement of this invention may be adapted for use requiring the information provided by magnetic domain apparatus 10.

What has been described is considered to be only one specific illustrative timing arrangement according to the principles of this invention and it is to be understood that various and numerous other arrangements may be devised by one skilled in the art without departing from the spirit and scope thereof as defined by the accompanying claims.

I claim:

1. A readout timing arrangement for single-wall magnetic domain apparatus comprising magnetic media in which single-wall magnetic domains may be created and propagated, means for generating an in-plane magnetic rotating field for propagating said domains, and a domain detector array, characterized in that a phase detection circuit is provided for detecting the second harmonic component of voltage signals generated at said detector array by said propagating field for generating phase angle signals and being further characterized in circuit means operated responsive to said phase angle signals for generating strobe signals for detecting domain-generated output signals at said detector array.

2. A readout timing arrangement for single-wall magnetic domain apparatus comprising magnetic media in which single-wall magnetic domains may be created and propagated, means for generating an inplane magnetic rotating field for propagating said domains in said media, and a domain detector array, characterized in that a phase detection circuit is provided for detecting the second harmonic component of voltage signals generated at said detector array by said propagating field for generating phase angle data representative of zero crossings of said second harmonic signals, circuit means for combining said phase angle data and data representative of propagation delay in said magnetic media for generating time delay signals, and circuit means operated responsive to said time delay signal for generating strobe signals for detecting domain-generated output signals at said detector array.

3. A readout timing arrangement according to claim 2 in which said magnetic domain apparatus also comprises integrator circuit means for integrating input voltage signals generated at said detector array and for generating output voltage signals of a level as determined by said integrating of said input voltage signals, characterized in that said integrator circuit means is operated responsive to said time delay signals.

4. A readout timing arrangement according to claim 2 in which said magnetic domain apparatus also comprises output comparator circuit means for comparing said level of said output voltage signals and a predetermined voltage level for generating output information signals characterized in that said output comparator circuit is enabled by said strobe signals.

5. A readout timing arrangement for single-wall magnetic domain apparatus including magnetic media in which single-wall magnetic domains may be created and propagated, means for generating an inplane magnetic rotating field for propagating said domains in said media, a domain output detector array, integrator circuit means for integrating input voltage signals generated in said detector array for generating output voltage signals of a level indicative of the magnitude of said input voltage signals, and output comparator circuit means for comparing the level of said output voltage signals and a predetermined voltage level and for generating information output signals responsive to said comparing, characterized in a phase detection circuit for detecting voltage signals of the second harmonic frequency of the fundamental frequency of voltage signals generated by said propagating field at said detector array for generating phase angle data signals and circuit means operated responsive to said data signals for generating strobe signals, said output comparator circuit means being operable responsive to said strobe signals.

6. A readout timing arrangement according to claim 5

Further characterized in
filter circuit means for blocking transmission of said voltage signals of said second harmonic frequency from said integration circuit means.

7. A readout timing arrangement according to claim 6

Further characterized in
circuit means for adding predetermined propagation delay data signals to said phase angle data signals.

* * * * *